(12) United States Patent  
Schemmann

(10) Patent No.: US 8,547,172 B1
(45) Date of Patent: Oct. 1, 2013

(54) OPTICAL TRANSMITTER WITH MULTIPLE ISOLATED INPUTS AND SIGNAL COMBINING NETWORK

(75) Inventor: Marcel F. Schemmann, Maria Hoop (NL)

(73) Assignee: Arris Enterprises, Inc., Suwanee, GA (US)

( * ) Notice: Subject to any disclaimer, the term of this patent is extended or adjusted under 35 U.S.C. 154(b) by 0 days.

(21) Appl. No.: 13/359,623

(22) Filed: Jan. 27, 2012

Related U.S. Application Data

(60) Provisional application No. 61/437,431, filed on Jan. 28, 2011.

(51) Int. Cl.
*H03F 3/68* (2006.01)
(52) U.S. Cl.
USPC .................. 330/124 R; 330/295; 330/284
(58) Field of Classification Search
USPC ...................... 330/124 R, 284, 295
See application file for complete search history.

(56) References Cited

U.S. PATENT DOCUMENTS

| | | | |
|---|---|---|---|
| 4,263,521 A * | 4/1981 | Senger | 327/95 |
| 5,122,690 A * | 6/1992 | Bianchi | 326/87 |
| 6,229,375 B1 * | 5/2001 | Koen | 327/351 |
| 6,737,841 B2 * | 5/2004 | Wrathall | 323/282 |
| 6,794,934 B2 * | 9/2004 | Betti-Berutto et al. | 330/124 R |
| 7,005,919 B2 * | 2/2006 | Petrovic et al. | 330/149 |
| 7,248,109 B2 * | 7/2007 | Burns et al. | 330/124 R |

\* cited by examiner

*Primary Examiner* — Patricia Nguyen
(74) *Attorney, Agent, or Firm* — Troy A. Van Aacken

(57) ABSTRACT

Systems and methods can provide an optical transmitter/combiner having improved isolation and signal to noise ratio performance. The input ports can be amplified with single ended amplifiers, attenuated with a loss network, combined and re-amplified with a second amplifier stage. The amplifier distortion performance, loss and gain levels can be chosen such that the second order distortions of the input port amplifier and the amplifier following a combiner are self-cancelling such that the distortion can be reduced. The obtained distortion performance can be reasonable while gain and signal to noise ratio are improved.

20 Claims, 5 Drawing Sheets

OPTICAL TRANSMITTER WITH MULTIPLE ISOLATED INPUTS AND SIGNAL COMBINING NETWORK

RELATED APPLICATIONS

This application claims priority as a non-provisional of U.S. Provisional Patent Application Ser. No. 61/437,431, entitled "Optical Transmitter with Multiple Isolated Inputs and Signal Combining Network," filed Jan. 28, 2011, which is incorporated herein by reference in its entirety.

TECHNICAL FIELD

This disclosure relates to optical transmitter/combiners with a plurality of optical input signals and one or more optical output signals.

BACKGROUND

Optical transmitters/combiners can be used for the transmission of broadcast and narrowcast optical signals in a communication network. Communication networks can include CATV, FTTH (Fiber to the Home) and FTTC (Fiber to the Curb). A communication network can consist of a large number of optical transmitter/combiners, nodes, and distribution networks between the nodes and the end users. Communication networks can be used to transmit one or more optical broadcast signals to a large number of nodes and one or more narrowcast optical signals can be transmitted to smaller number of nodes or a specific node. Splitters can be used to distribute broadcast optical signals to the inputs of a plurality of optical transmitters/combiners. An optical transmitter/combiner can have one or more inputs for narrowcast or broadcast signals and can produce one or more outputs where the narrowcast and broadcast signals can be combined. The combining of narrowcast and broadcast signals can produce a reverse leakage from the narrowcast signal input to the broadcast signal input. The reverse leakage can cause a fraction of the narrowcast signal being present at the broadcast signal input of other optical transmitter/combiners resulting in a combination of the intended signals and the fraction of the unwanted narrowcast signal. The reverse leakage of the narrowcast signal can be reduced by providing sufficient isolation between the broadcast and narrowcast inputs of the transmitter/combiner.

SUMMARY

Systems and methods can operate to transmit/combine broadcast and narrowcast broadband signals. Systems can include a set of first single ended amplifiers, a combiner network, a second single ended inverting amplifier and a loss network. The first single ended inverting amplifiers have a first forward gain factor and receive input signals. The combiner network includes one or more combiners operable to combine the outputs of the single ended inverting amplifiers to generate a combined signal. The second single ended inverting amplifier has a second forward gain factor and receives the combined signal. The loss network is provided between each of the first single ended inverting amplifiers and the combiner network, and attenuates the output of the first single ended inverting amplifiers.

Methods can include: receiving a plurality of first and second input signals; amplifying the plurality of first and second input signals through a first amplifier stage by a forward gain factor wherein single ended amplifiers are used; attenuating the plurality of first signal outputs of the first amplifier stage through a loss network comprising a first loss value; splitting the plurality of second signal outputs of the first amplifier stage with a loss comprising a second loss factor; attenuating the plurality of split second signal outputs comprising a third loss factor; combining the attenuated first signal outputs and second attenuated second signal outputs with a loss comprising a fourth loss factor; amplifying the combined first and second signal outputs through a second amplifier stage by the forward gain factor wherein single ended amplifiers are used, wherein the sum of the first and fourth losses are chosen to approximately cancel the forward gain factor and wherein the sum of the second, third and fourth losses are chosen to approximately cancel the forward gain factor.

BRIEF DESCRIPTION OF THE DRAWINGS

Like reference numbers and designations in the various drawings indicate like elements.

DETAILED DESCRIPTION

In some implementations of this disclosure, methods, systems, and apparatus can operate to combine broadcast and narrowcast signal inputs while reducing the reverse leakage of narrowcast signals on the broadcast signal input.

Figure 1:
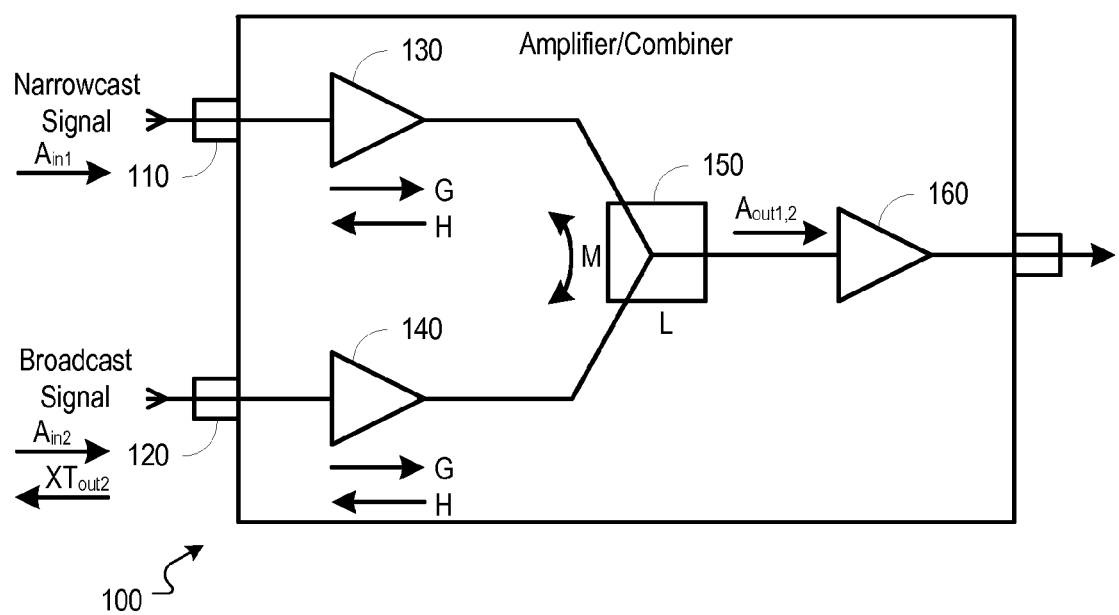
FIG. 1 is a block diagram illustrating an example of an amplifier/combiner operable to combine a broadcast and narrowcast signals.

FIG. 1 is a block diagram illustrating an example of an amplifier/combiner operable to combine a broadcast and a narrowcast signal. A narrow cast signal $A_{in1}$ can be connected to input port 110 and a broadcast signal $A_{in2}$ can be connected to port 120 of amplifier/combiner 100. For simplicity the input signal levels of the broadcast and narrowcast signals are assumed to be the same. However, different input levels can be used. The output of the amplifier/combiner can be provided to a laser or a laser driver where the laser provides and E/O conversion.

The broadcast and narrowcast signals can be amplified by a gain of G dB (decibels) through amplifiers 130 and 140 respectively and combined through combiner 150. The combined broadcast and narrowcast signals can be amplified by amplifier 160. The combiner can have a loss of L dB. The output level of the combiner in dB can be represented by $A_{out1,2}$.

$$A_{out1,2} = A_{in1,2} + G - L$$

The narrowcast signal connected to input port 110 can leak to input port 120 by $XT_{out2}$ dB where the combiner isolation can be represented by M dB and the reverse gain of amplifier 140 by H dB. M and H are typically a negative numbers.

$$XT_{out2} = A_{in1} + G + M + H$$

The isolation between input port 110 and 120 can be represented as the ratio of crosstalk and the input level.

Isolation=$XT_{out2}-A_{in1}=(A_{in1}+G+M+H)-A_{in1}=G+M+H$

However, the sum of G+M+H may not provide the desired isolation. Some implementations of a amplifier/combiner can include one or more additional amplifiers to improve isolation.

Figure 2:
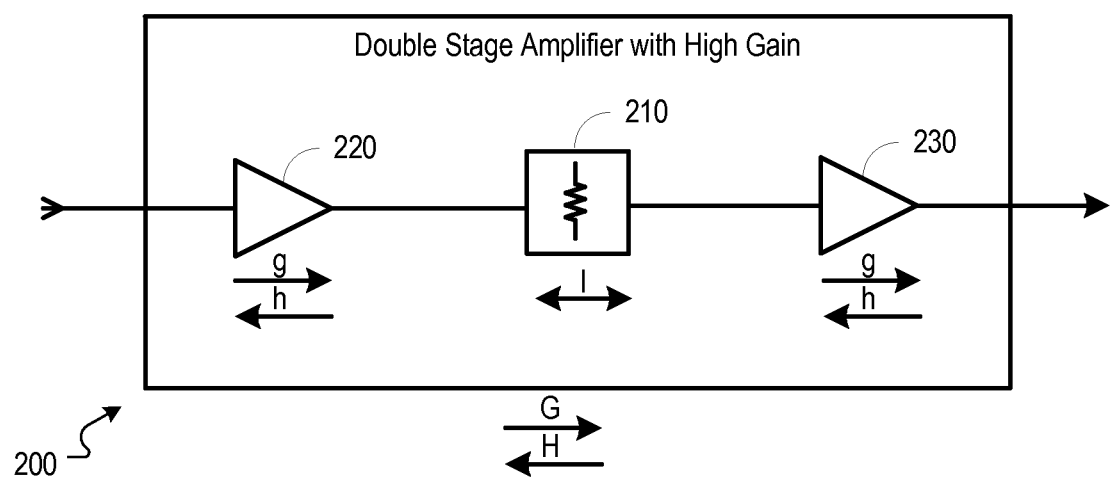
FIG. 2 is a block diagram illustrating an example of a double stage amplifier with high gain operable to amplify an input signal with improved isolation.

FIG. 2 is a block diagram illustrating an example of a double stage high gain amplifier operable to amplify an input signal with improved isolation. In some implementations the isolation of a amplifier/combiner can be improved by adding a loss network with a proper loss value between amplifier 220 and amplifier 230. In some implementations an attenuator 210 between amplifier 220 and amplifier 230 can be used.

Amplifiers 220 and 230 can have a forward gain of g dB and a reverse gain of h dB. The forward gain of an amplifier is the ratio of output to input power or amplitude, and is usually measured in decibels. The reverse gain of an amplifier is also a ratio where the amplifiers input is measured when a signal is applied to the amplifiers output (i.e., isolation). The attenuator 210 provides a loss l dB between amplifiers 220 and 230. The overall forward gain of double stage amplifier 200 can be represented by G dB.

$G=g+g-l$

When the forward gain g for amplifiers 220 and 230 are equal and set to the loss of the attenuator 210 the overall forward gain G dB of the double stage amplifier 200 can be reduced to g dB.

$G=g$

When the reverse gain h for amplifiers 220 and 230 are equal the overall reverse gain H dB of the double stage amplifier 200 can be represented as H dB.

$H=h-l+2h-l$

The net amplifier isolation for the double stage amplifier 200 where the forward gain g dB of amplifiers 220 and 230 are set equal to the loss l dB of attenuator 210 can be 2h.

$G+H=(g+h)+h-l=2h$

Isolation can be improved with a dual stage amplifier over a single stage amplifier because of the doubling of the amplifier reverse gain component (2h>G+H).

Double amplifier stages with loss between the amplifiers can be effective in improving isolation but are costly. To reduce cost, implementations using single-ended amplifiers can be preferred over push-pull amplifiers (push-pull amplifiers require two amplifiers per single stage); however, such amplifiers can produce unwanted or unreasonable second order distortions. A push-pull amplifier can be characterized by an amplifier that can drive a positive or negative current into a load. In some implementations, second order distortions can be minimized through the cascading of two inverting single ended amplifiers where the loss between the amplifiers can be set nearly equal to the gain of the amplifiers.

Figure 3:
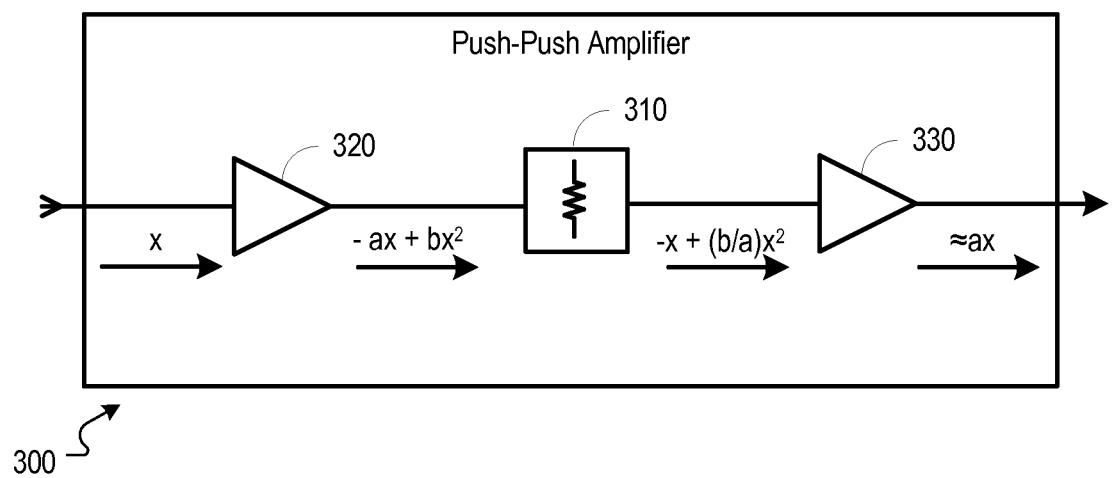
FIG. 3 is a block diagram illustrating an example of a push-push amplifier operable to amplify an input signal where second order distortions can be minimized.

FIG. 3 is a block diagram illustrating an example of a push-push amplifier operable to amplify an input signal where second order distortions can be minimized. In one implementation inverting amplifier 320 can have an input signal of level x and can produce an output of $-ax+bx^2$ where x is the input signal, a is the liner gain, and b is the second order distortion coefficient. Attenuator 310 can be set with a loss factor of 1/a resulting in the input to the second amplifier 330 of $-x+(b/a)x^2$. Neglecting higher terms of b, amplifier 330 can produce an output including distortion of:

$$ax-bx^2+b\left(-x+\left(\frac{b}{a}\right)x^2\right)^2 \approx ax-bx^2+bx^2=ax$$

Because both inverting amplifiers 320 and 330 have the same input signal (apart from distortions that are significantly lower in level) the second order terms can be self-canceling when the attenuator 310 can be set with a loss factor of 1/a. One disadvantage with this implementation can be that each inverting amplifier 320 and 330 can have an identical contribution to the noise figure of the amplifier chain.

Figure 4:
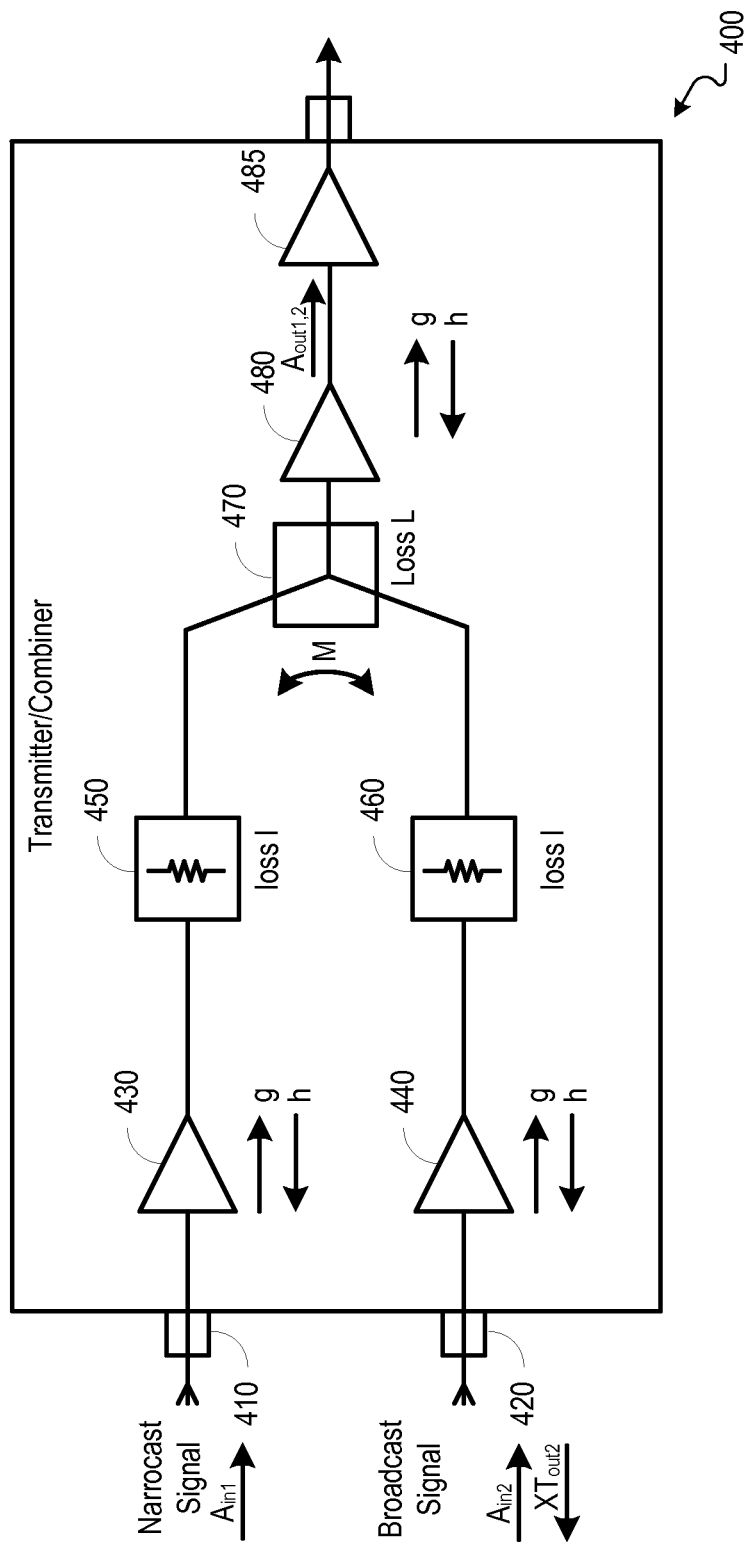
FIG. 4 is a block diagram illustrating an example of a transmitter/combiner operable to combine a broadcast and narrow cast signal with improved isolation and second order distortions.

FIG. 4 is a block diagram illustrating an example of a transmitter/combiner operable to combine a broadcast and narrowcast signal with improved isolation and second order distortions. A narrowcast signal $A_{in1}$ can be connected to input port 410 and a broadcast signal $A_{in2}$ can be connected to input port 420 of transmitter/combiner 400. For simplicity, the input signal levels of the broadcast and narrowcast signals are assumed to be the same. However, it should be understood that different input signal levels can be used.

The broadcast and narrowcast signals can be amplified by a gain of g dB (decibels) through amplifiers 430 and 440 respectively. The output signal of amplifier 430 can be attenuated by l dB by attenuator 450. Likewise, the output signal of amplifier 440 can be attenuated by l dB by attenuator 460. The attenuated broadcast and narrowcast signals can be combined by combiner 470. Combiner 470 can introduce a loss of L dB. The combined broadcast and narrowcast signals can be amplified by amplifier 480 and transmitted by output stage 485. Amplifiers 430, 440, and 480 can be single-ended. The forward gain g dB of amplifiers 430, 440 and 480 can be set to the loss between the input amplifier output and the combiner output such that the overall broadcast and narrowcast signal loss cancels the amplifier gain g dB.

$g=l+L$

The output level of amplifier 480 can be represented by $A_{out1,2}$.

$A_{out1,2}=A_{in1,2}+g$

The narrowcast signal connected to input port 410 can leak to input port 420 by $XT_{out2}$ dB where the combiner isolation can be represented by M dB and the reverse gain of amplifier 440 by h dB. M and H are typically a negative numbers. The gain of amplifier 400 can be higher than amplifier 100 (e.g., amplifier 100 of FIG. 1) by an amount approximating the loss L dB of the combiner 470.

$XT_{out2}=A_{in1}g-l+M-l+h$

Using $L=g-l$.

$XT_{out2}=A_{in1}+g-2(g-L)+M+h=A_{in1}+2L-g+M+h$

The isolation between input port 410 and 420 can be represented as the ratio of crosstalk and the input level. The isolation on the broadcast signal input 420 can be calculated.

Isolation=$XT_{out2}-A_{in1}=(A_{in1}+2L-g+M+H)-A_{in1}=2L-g+M+H$

Given typical values for amplifier gains (forward and reverse), combiner loss, and combiner isolation the isolation between input ports of transmitter/combiner 400 provides acceptable isolation and can be greater than amplifier/combiner 100 (e.g., amplifier/combiner 100 of FIG. 1).

$2L-g+M+H>G+M+H$

In some implementations, one or more of amplifiers 430, 440, and 480 can be inverting amplifiers with each amplifier having a gain factor of $-a$ and having a input signal of level x and a second order distortion coefficient of b. The output of amplifier 430 including distortion can be calculated as:

$$-ax_1 + bx_1^2$$

The output of amplifier 440 including distortion can be represented by:

$$-ax_2 + bx_2^2$$

The output of amplifier 480 including distortion can be represented by:

$$a(x_1 + x_2) - b(x_1^2 + x_2^2) + b\left(-(x_1 + x_2) + \left(\frac{b}{a}\right) + (x_1^2 + x_2^2)\right)^2$$

Neglecting the higher terms of b (since b<<a) simplifies the output of amplifier 480, such that the output including distortion can be described as:

$$a(x_1 + x_2) - 2bx_1x_2$$

The output of amplifiers 430 and 440 can be operable to produce negligible distortion when either inputs $x_1$ or $x_2$ are zero. When both $x_1$ and $x_2$ are non-zero there can be a distortion contribution from mixing. The total power of the combined signals $x_1$ and $x_2$ can be limited to a value determined by the dynamic range of amplifier 480. The power that can be tolerated at the input of amplifier 430 can decrease as more signal power can be injected into the input of amplifier 440. The distortion contribution can be maximized (worst case) when each amplifier 430 and 440 input receives the same input power level and can be illustrated as a series of sine waves at input of amplifiers 430 and 440 where p is the amplitude factor.

$$x_1(t) = p(\cos(w_1 t) + \cos(w_2 t))$$

$$x_2(t) = p(\cos(w_3 t) + \cos(w_4 t))$$

The input signal to an output amplifier 485, where a is the gain, can be within the dynamic range of amplifier 485.

$$ap(\cos(w_1 t) + \cos(w_2 t) + \cos(w_3 t) + \cos(w_4 t))$$

The resulting distortion term for the transmitter/combiner 400 can be calculated.

$$2b(p \cos(w_1 t) + \cos(w_2 t))(\cos(w_3 t + \cos(w_4 t)) = -bp^2{}_1(++ \cos((w_1 + w_3)t) + \cos((w_1 - w_3)t) + \cos((w_1 + w_4)t + \cos((w_1 - w_4)t) + \cos((w_2 + w_3)t) + \cos((w_2 - w_3)t) + \cos((w_2 + w_4)t) + \cos((w_2 - w_4)t)$$

While the number of distortion terms for the transmitter/combiner 400 are greater than those for the push-push amplifier 300 (e.g. push-push amplifier 300 of FIG. 3) the level of distortion is acceptable. Additionally, the distortion power at the output of amplifier 480 can be half of that of a single amplifier implementation (e.g. amplifier 230 of FIG. 2) even for the worst case combination a amplifier 430 and 440 input signal levels. This is illustrated below by the second order distortion contribution of single amplifier 230:

$$b(p(\cos(w_1 t) + \cos(w_2 t) + \cos(w_3 t + \cos(w_4 t))^2 = bp^2{}_1(\cos((w_1 + w_2)t) + \cos((w_1 - w_2)t) + \cos((w_1 + w_3)t) + \cos((w_1 - w_3)t) + \cos((w_1 + w_4)t + \cos((w_1 - w_4)t) + \cos((w_2 + w_3)t) + \cos((w_2 - w_3)t) + \cos((w_2 + w_4)t + \cos((w_2 - w_4)t) + \cos((w_3 + w_4)t) + \cos((w_3 - w_4)t) + \cos(2w_1 t) + \cos(2w_2 2t) + \cos(2w_3 t) + \cos(2w_4 t) + 4)$$

The single amplifier output contains much many more distortion terms than the amplifier 400 even under worst case conditions. Amplifier 400 can have up to half the output distortion of a single ended amplifier (230 in FIG. 2).

Amplifier 480 can receive the combined noise of amplifiers 430 and 440. The output of Amplifier 480 can contain its noise contribution in addition to the combined noise of amplifiers 430 and 440, due to g=1+L. The total power noise output of the transmitter/combiner 400 can be three times higher than the output of a single amplifier 230 (e.g., 230 of FIG. 2). The combiner amplifier 480 output level can be higher than that of combiner 150 (e.g., combiner 150 of FIG. 1) by the combiner loss that can be factor of 2. The output level of transmitter/combiner 400 can be twice that of amplifier/combiner 100 (e.g. amplifier/combiner 100 of FIG. 1) and the noise level can be three times higher than that of a single amplifier 230 (FIG. 2) such that the signal to noise ratio of transmitter/combiner 400 can be one third that of the single amplifier 230 (e.g., transmitter 230 of FIG. 2).

The total noise output of the push-push amplifier 300 (e.g., push-push amplifier 300 of FIG. 3) can be twice of a single amplifier implementation. Two amplifier combinations could be used to replace amplifier 130 (amplifier 130 of FIG. 1) and amplifier 140 (amplifier 140 of FIG. 1) with outputs to combiner 150 (e.g., combiner 150 of FIG. 1), requiring four amplifiers. This represents a conventional low distortion high isolation input structure. While the total noise contribution at the inputs of combiner 150 (e.g., combiner 150 of FIG. 1) can be equivalent to that of four amplifiers the output of combiner 150 (e.g., combiner 150 of FIG. 1) could have an output noise power equal to twice that of the single amplifier implementation of the amplifier/combiner 100 (e.g., amplifier/combiner 100 of FIG. 1). The signal output level of amplifier/combiner 100 can be half that of single amplifier 230 fFIG. 2. This can result in a SNR (signal to noise ratio) of ¼=(½)/2 when compared to a single amplifier (230 in FIG. 2) operating with the same input signal conditions. The SNR provided by the transmitter/combiner 400 can be superior to the implementation where the single amplifier implementation of amplifier/combiner 100 (amplifier/combiner 100 of FIG. 1) are replaced dual amplifiers as in FIG. 2.

Figure 5:
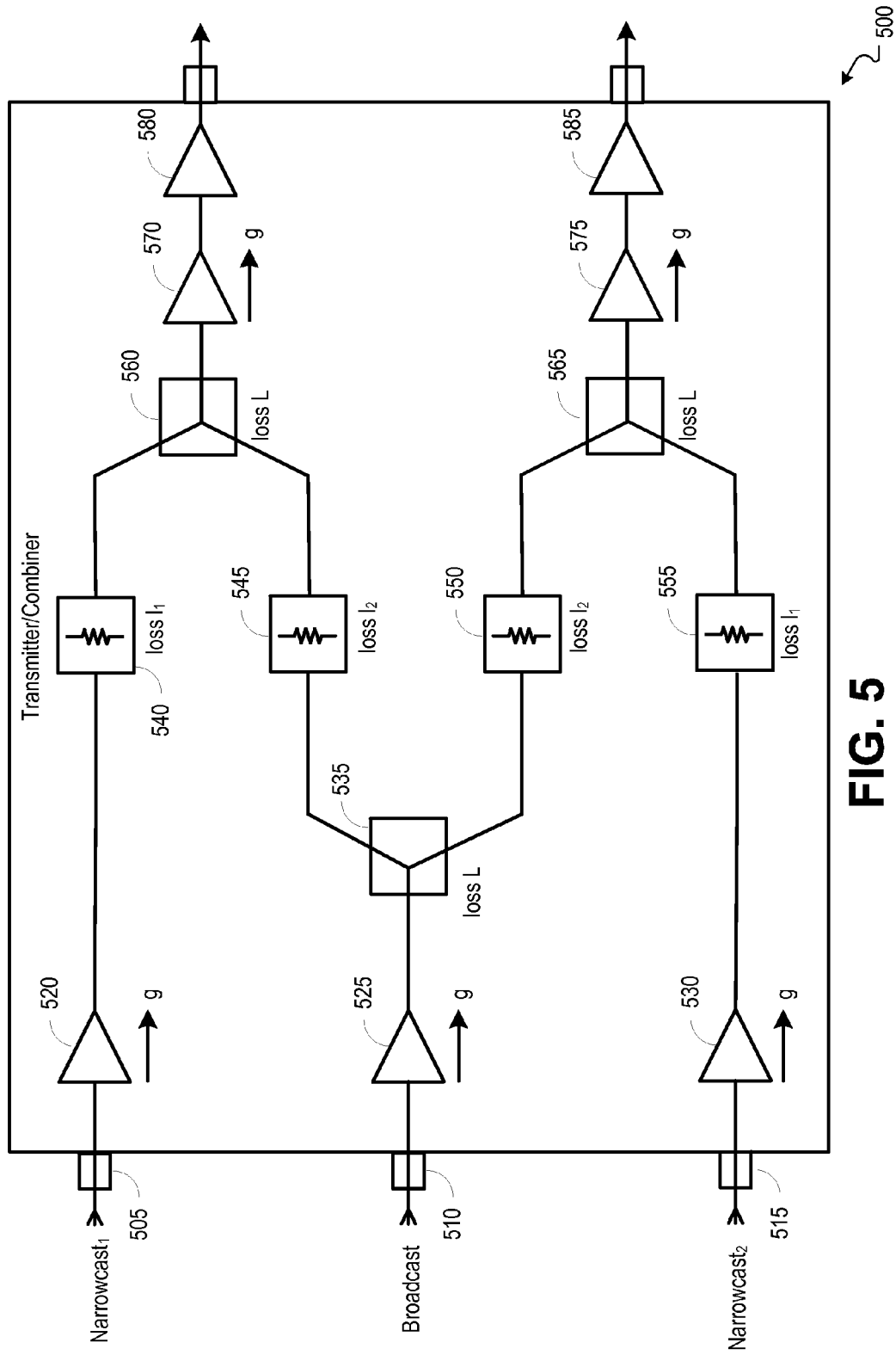
FIG. 5 is a block diagram illustrating an example of a transmitter/combiner with dual outputs.

FIG. 5 is a block diagram illustrating an example of a transmitter/combiner with dual outputs. In one implementation the transmitter/combiner 500 can have narrowcast inputs 505 (e.g., Narrowcast$_1$) and 515 (e.g., Narrowcast$_2$) and a broadcast input 510. Each narrowcast signal input 505 and 515 can be connected to a separate single ended amplifier 520 and 530 respectively. The output of single ended amplifiers 520 and 530 can be connected to attenuators 540 and 550 respectively. Attenuators 540 and 550 can introduce a loss of loss $l_1$. The broadcast signal can be connected to a single ended amplifier 525. The output of amplifier 525 can be connected to splitter 535 that can introduce a loss of loss L. The outputs of splitter 535 can be connected to attenuators 545 and 550 that can introduce a loss of loss $l_2$. The loss $l_2$ can be less than loss $l_1$ by an amount of loss L.

Combiner 560 can combine the outputs of attenuators 540 (Narrowcast$_1$) and 545 (Broadcast$_1$). The output of combiner 560 (Narrowcast$_1$+Broadcast$_1$) can be amplified by single ended amplifier 570 and transmitted by output stage 580, combiner 565 can combine the outputs of attenuators 550 (Narrowcast$_2$) and 555 (Broadcast$_2$). The output of combiner 565 (Narrowcast$_2$+Broadcast$_2$) can be amplified by single ended amplifier 575 and transmitted by output stage 585. To achieve reasonable isolation, the loss of the attenuators (540, 545, 550, and 555) and splitter/combiners (535, 560, and 565) along with the forward gain of the single ended amplifiers (520, 525, 530, 570, and 575) can be set so g≈loss $l_1$+loss L≈2loss L+loss $l_2$. To reduce the effects of second order distortions single ended amplifiers (520, 525, 530, 570, and 575) can be inverting amplifiers.

What is claimed is:

1. A system, comprising:
a plurality of independent signal inputs wherein the independent signal inputs are each individually received by a set of first single ended inverting amplifiers with a first forward gain factor;
a combiner network including one or more combiners operable to combine the outputs of the set of first single ended inverting amplifiers generating a combined signal;
a second single ended inverting amplifier operable to receive the combined signal, the second single ended inverting amplifier having a second forward gain factor; and
a loss network between each of the first single ended inverting amplifiers and the combiner network, the loss network being operable to attenuate the output of the first single ended inverting amplifiers.

2. The system of claim 1, wherein the set of first single ended inverting amplifiers and the second inverting single ended amplifier have the same characteristics and the first and second forward gain factors are equal.

3. The system of claim 1, wherein the set of first single ended inverting amplifiers and the second inverting single ended amplifier have different characteristics.

4. The system of claim 2, wherein the loss between the set of first single ended inverting amplifiers and the second single ended inverting amplifier is determined by the sum of losses in the loss network and the combiner network and approximates the first forward gain factor.

5. The system of claim 3, wherein the loss between the set of first single ended inverting amplifiers and the second single ended inverting amplifier is determined by the sum of losses in the loss network and the combiner network and is chosen, wherein the second order distortion generated by the second single ended inverting amplifier approximates half of that generated by the set of first single ended inverting amplifiers given the input signal received at each input of the set of first single ended inverting amplifier.

6. The system of claim 1, wherein the plurality of signal inputs include one or more broadcast and one or more narrowcast signals.

7. The system of claim 6, wherein the combiner network combines one said broadcast signal with one said narrowcast signal.

8. The system of claim 1, wherein the system is used in a CATV based communication system.

9. The system of claim 1, wherein the system is used in a Fiber to the Home or Fiber to the Curb based communication system.

10. A system, comprising:
a set of first single ended inverting amplifiers operable to receive a plurality of signal inputs, wherein the signal inputs are each individually received by the set of first single ended inverting amplifiers, respectively;
a splitter network comprising one or more splitters operable to split the output of the set of one or more first single ended inverting amplifiers to generate one or more split signals introducing a first loss having a first loss value;
a combiner network comprising one or more combiners operable to combine the outputs of the set of one or more first single ended inverting amplifiers and the one or more split signals generating one or more combined signals introducing a second loss of a second value;
one or more second single ended inverting amplifiers, each second single ended inverting amplifier being operable to receive one of the combined signals and produce an output;
a first loss network comprising a third loss between the set of first single ended inverting amplifiers and the combining network; and
a second loss network comprising a fourth loss between the splitter network and the combining network.

11. The system of claim 10, wherein the first and second single ended inverting amplifiers have the same characteristics and that the sum of the first and second losses and the sum of the second, third and fourth losses approximate the forward gain of the single ended inverting amplifier.

12. The system of claim 10, wherein the first and second single ended inverting amplifiers have different characteristics and the sums of the first and second losses approximate the sums of the second, third and fourth losses and are chosen, wherein the second order distortion generated by the second single ended inverting amplifiers approximates a half of that generated by the first single ended inverting amplifiers given the input signal received at the first single ended inverting amplifier input.

13. The system of claim 10, wherein the plurality of signal inputs include one or more broadcast and one or more narrowcast signals.

14. The system of claim 13, wherein one of the broadcast signal inputs is outputted by a plurality of the second single ended inverting amplifiers.

15. The system of claim 14, wherein one or more of the narrowcast signal inputs are outputted by a plurality of the second single ended inverting amplifiers.

16. A method comprising:
receiving a plurality of first and second input signals;
amplifying the plurality of first and second input signals through a first amplifier stage by a forward gain factor wherein single ended amplifiers are used;
attenuating the plurality of first signal outputs of the first amplifier stage through a loss network comprising a first loss value;
splitting the plurality of second signal outputs of the first amplifier stage with a loss comprising a second loss factor;
attenuating the plurality of split second signal outputs comprising a third loss factor;
combining the attenuated first signal outputs and second attenuated second signal outputs with a loss comprising a fourth loss factor;
amplifying the combined first and second signal outputs through a second amplifier stage by the forward gain factor, wherein single ended amplifiers are used;
wherein the sum of the first and fourth losses are chosen to approximately cancel the forward gain factor; and
wherein the sum of the second, third and fourth losses are chosen to approximately cancel the forward gain factor.

17. The method of claim 16, wherein the plurality of input signals includes broadcast and narrowcast signals.

18. The method of claim 16, wherein the first and second single ended amplifiers are inverting.

19. The method of claim 16, wherein the use is in a CATV based communications system.

20. The method of claim 16, wherein the use is in a Fiber to the Home or Fiber to the Curb based communication system.

* * * * *